(12) United States Patent
Ansari

(10) Patent No.: US 10,634,642 B2
(45) Date of Patent: Apr. 28, 2020

(54) PACKAGING FOR INTEGRATED CIRCUITS

(71) Applicant: DNAe Group Holdings Limited, London (GB)

(72) Inventor: Zahid Ansari, Cambridge (GB)

(73) Assignee: DNAE GROUP HOLDINGS LIMITED, London (GB)

( * ) Notice: Subject to any disclaimer, the term of this patent is extended or adjusted under 35 U.S.C. 154(b) by 0 days.

(21) Appl. No.: 16/302,359

(22) PCT Filed: May 15, 2017

(86) PCT No.: PCT/GB2017/051352
§ 371 (c)(1),
(2) Date: Nov. 16, 2018

(87) PCT Pub. No.: WO2017/199009
PCT Pub. Date: Nov. 23, 2017

(65) Prior Publication Data
US 2019/0302051 A1 Oct. 3, 2019

(30) Foreign Application Priority Data

May 18, 2016 (GB) .................................. 1608758.7

(51) Int. Cl.
G01N 27/414 (2006.01)
H01L 23/31 (2006.01)
(Continued)

(52) U.S. Cl.
CPC ....... *G01N 27/4148* (2013.01); *G01N 27/414* (2013.01); *H01L 23/3121* (2013.01); *H01L 23/3135* (2013.01); *H01L 27/088* (2013.01); *H01L 24/04* (2013.01); *H01L 24/48* (2013.01); *H01L 2224/04042* (2013.01); *H01L 2224/48091* (2013.01); *H01L 2224/48227* (2013.01);
(Continued)

(58) Field of Classification Search
None
See application file for complete search history.

(56) References Cited

U.S. PATENT DOCUMENTS 4,567,006 A 1/1986 Covington et al.
8,461,587 B2 6/2013 Kurth et al.
(Continued)

FOREIGN PATENT DOCUMENTS

CN 105 261 640 A 1/2016
WO 2014/057289 A1 4/2014

OTHER PUBLICATIONS

Cané, C., et al. "Microtechnologies for PH ISFET Chemical Sensors." Microelectronics Journal, vol. 28, No. 4, 1997, pp. 389-405., doi:10.1016/s0026-2692(96)00068-7. (Year: 1997).*
(Continued)

*Primary Examiner* — J. E. Schoenholtz
(74) *Attorney, Agent, or Firm* — Greenberg Traurig, LLP

(57) ABSTRACT

An assay device (10) is provided. The device comprises an integrated circuit (IC) (16) comprising a plurality of ISFETs (18); an over-moulded layer (17) which partially covers the IC, such that the plurality of ISFETs remain uncovered; and a film (20) provided across substantially the entire IC. The film acts as a passivation and/or sensing layer for each of the ISFETs. In addition, the film acts as a barrier layer to encase the over-moulded layer.

5 Claims, 1 Drawing Sheet

(51) Int. Cl.
*H01L 27/088* (2006.01)
*H01L 23/00* (2006.01)
(52) U.S. Cl.
CPC .............. *H01L 2224/48465* (2013.01); *H01L 2924/10253* (2013.01); *H01L 2924/14* (2013.01); *H01L 2924/15313* (2013.01); *H01L 2924/1815* (2013.01)

(56) References Cited

U.S. PATENT DOCUMENTS

| | | | | |
|---|---|---|---|---|
| 9,470,652 | B1* | 10/2016 | Hooper | ............... G01N 27/4148 |
| 2009/0051052 | A1* | 2/2009 | Yoshioka | ............ H01L 23/3107 |
| | | | | 257/788 |

OTHER PUBLICATIONS

International Search Report and Written Opinion for International Application No. PCT/GB2017/051352 dated Aug. 16, 2017.

* cited by examiner

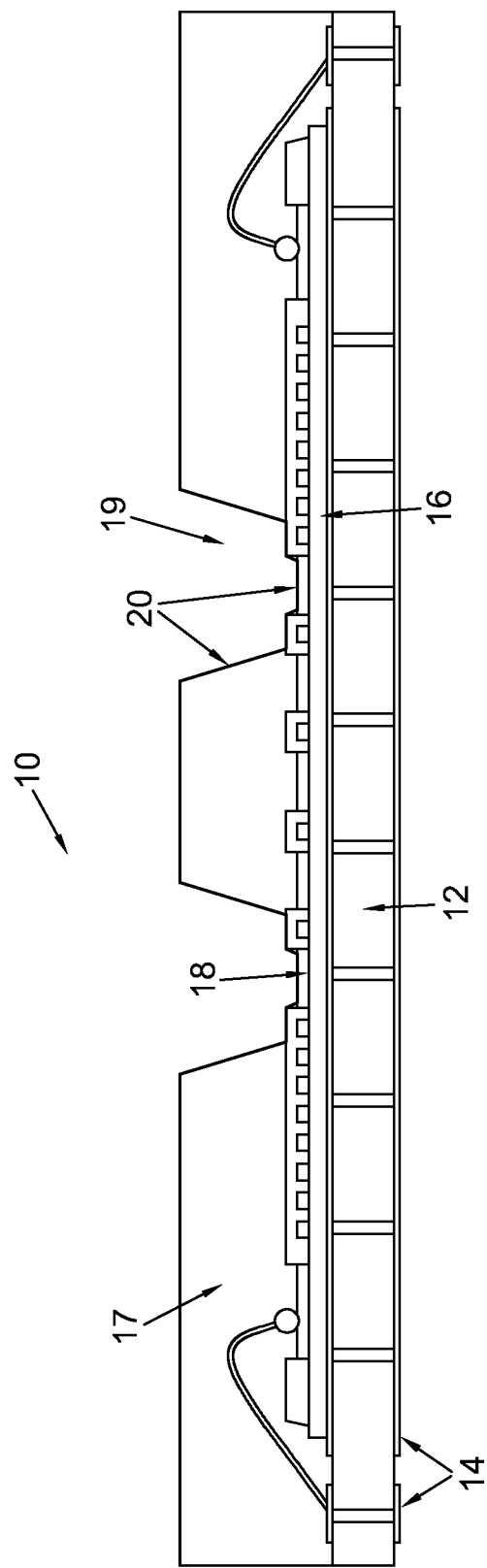

PACKAGING FOR INTEGRATED CIRCUITS

This invention relates to improvements in or relating to packaging for integrated circuits (IC) and, in particular, to packaging for ICs that are intended to be exposed to fluids in use.

A number of standard IC package manufacturing processes are available that enable exposure of part of the surface of sensor IC's to either the atmosphere or fluids. The most cost-effective option for high volume manufacture is over-moulding of the IC with a thermoset plastic material. These thermoset materials have a complex set of constraints to ensure manufacturability and reliability of the IC product, and comply with safety requirements, such as flammability requirements and other regulatory requirements, such as industry standards for Restriction of Hazardous Substances. These mould compounds have complex proprietary compositions, including a combination of organic and inorganic materials. Use of non-standard mould compounds has a negative impact on cost and limits the number of potential manufacturing partners.

The complex chemical composition of semiconductor industry mould compounds results in poorly controlled and unpredictable surface characteristics. Furthermore, the materials are not designed to withstand exposure to fluids, and they leech chemicals when exposed to fluids and heat. Thus, the vast majority of mould compounds are unsuitable for use as the walls of chambers in which chemical reactions take place because chemicals can leech from the surface of the mould compound and interact with the reagents, whether gaseous or liquid, and impact on the result of the reaction. This is applicable to any reaction in which a chemical sensor is being exposed to gaseous or liquid reagents, in particular PCR (Polymerase chain reactions).

It is against this background that the present invention has arisen.

According to the present invention there is provided an assay device comprising: an integrated circuit (IC) comprising a plurality of ISFETs; an over-moulded layer which partially covers the IC, such that the plurality of ISFETs remain uncovered; a film provided across substantially the entire IC; wherein the film acts as a passivation and/or sensing layer for each of the ISFETs; and wherein the film acts as a barrier layer to encase the over-moulded layer.

The provision of a single layer across substantially the entire IC enables the assay device to utilise an industry standard over-moulding product without concerns about bio-compatibility because the single layer encases the over-moulded layer.

The film may act as a passivation layer, a sensing layer or both a passivation and a sensing layer. If the film acts as a passivation layer is may be fabricated from any dielectric with low ion transport characteristics. Such dielectric materials will not conduct current and they also act as a moisture barrier. Alumina and Hafnium dioxide are examples of dielectric materials that provide good passivation characteristics.

The film may be formed from a material that is compatible with both PCR and pH sensing. Forming the film from a material that is compatible with both PCR and pH sensing means that the chambers formed above the ISFETs can be used for PCR and/or pH sensing without the addition of any further layers.

The over-moulded layer may be formed from a thermoset plastic material. Thermoset plastic materials are well regulated in the context of IC manufacture and the ability to work with an industry standard thermoset plastic material is a considerable advantage in terms of cost and manufacturability.

The film may be less than 10 nm thick. The thickness of the film is selected to ensure that the over-mould layer is sealed so that no chemicals can leech from the over-mould compound into fluids in which PCR and/or pH sensing takes place. The film must also be sufficiently thin that it does not compromise the usable volume of the chambers formed above the ISFETs.

The film may be $Si_3N_4$, $Ta_2O_5$, $Al_2O_3$ or $SiO_2$. $Si_3N_4$, $Ta_2O_5$ and Alumina provide both good sensing and also good passivation. Films formed from any one of these compounds provide both sensing and passivation.

The film may be provided as two or more sub-layers. The provision of more than one layer across substantially the entire IC allows the different sub-layers to be selected to optimise certain characteristics. For example, a first sub-layer could be a 10 nm layer of $Al_2O_3$ and a second sub-layer could be a 1 nm layer of $Si_3N_4$ or $SiO_2$.

Silicon dioxide is advantageous in that is compatible with primer immobilisation and pH sensing as well as providing some level of passivation. A silicon dioxide film could therefore be provided in lieu of a standard sensing layer that would otherwise have been provided over the ISFET. However, as silicon dioxide is not an ideal passivation layer, a film comprising silicon dioxide as the sensing layer has a second sub-layer, for example a 20 nm-50 nm thick layer of $Ta_2O_5$ can be combined with a thin 2 nm-5 nm layer of $SiO_2$.

The sensing layer may be a pH sensing layer as exemplified above with the $SiO_2$ film. The assay device of the present invention can be manufactured by any technique that provides conformal moulding where the film follows the topography of the underlying structure of the device. Plasma deposition, atomic layer deposition and pulsed laser deposition are all techniques that could be utilised. Furthermore, any other technique capable of providing the required uniform thickness high quality film could also be used.

It is proposed that the chambers could be made PCR compatible by deposition of an extremely thin layer of any material that is compatible with both PCR and pH sensing. So, for example, a nanometre-scale layer of $Si_3N_4$ or $Ta_2O_5$ could be deposited using any process that would reliably ensure coverage of the mould compound. If the IC already has passivation on ISFET pads, then this sensing layer could be deposited on top of the passivation. However, if the deposited layer meets requirements for both passivation and sensing, then it could be used in lieu of the sensing layer currently deposited as part of the post-CMOS wafer manufacturing process. Thus, wafers could go from the CMOS fab to assembly without any need for post-CMOS processing. After assembly, the packaged IC's would be coated with the material that would act as both a passivation layer and a sensing layer. Care would need to be taken to ensure that the deposition process did not compromise solderability of the bottom electrical contacts of the IC package, but there are a number of ways to ensure that this requirement is met (e.g. masking, selective deposition, and etching).

Performance and reliability could be further optimised by a combination of two or more layers. For example, a 1 nm $Si_3N_4$ or $SiO_2$ layer could be deposited on top of a 10 nm $Al_2O_3$ layer. This would provide the better passivation of $Al_2O_3$, while preventing exposure of the PCR reaction to $Al_2O_3$ and offering a top layer compatible with primer immobilisation and pH sensing. If the top layer is used primarily for immobilisation and the underlying layer is compatible with the PCR chemistry, then the need for conformality of the top layer is reduced and lower cost deposition processes could be used for the top layer, if available.

The invention will now be further and more particularly described, by way of example only, and with reference to the accompanying drawings, in which:

FIG. 1 shows a schematic cross-section of a device according to the present invention.

FIG. 1 shows a device 10 which is a layered structure. The layers are provided on a package substrate 12 through which electrical connections 14 are provided. A silicon IC layer 16 is provided on the substrate 12. A plurality of ISFET pads 18 are provided on the silicon IC layer 16 together with CMOS passivation between the ISFET pads 18. A mould compound 17 is provided over those parts of the substrate 12 that are not provided with ISFET pads 18. The openings in the mould compound 17 above the ISFET pads 18 effectively provide wells 19 for fluid.

A film 20 providing passivation and sensing is provided over substantially the entire device 10. The film 20 follows the topology of the layers already laid down and provides a surface coating for the wells 19 to protect fluid from contacting the mould compound 17. The film 20 also covers the ISFET pads 18 where it provides sensing.

It will further be appreciated by those skilled in the art that although the invention has been described by way of example with reference to several embodiments it is not limited to the disclosed embodiments and that alternative embodiments could be constructed without departing from the scope of the invention as defined in the appended claims.

The invention claimed is:

1. An assay device comprising:
   an integrated circuit (IC) comprising a plurality of ISFETs;
   an over-moulded layer which partially covers the IC, such that the plurality of ISFETs remain uncovered;
   a film provided across the entire IC;
   wherein the film acts as a passivation and sensing layer for each of the ISFETs;
   wherein the film is provided as two or more sub-layers; and
   wherein the film acts as a barrier layer to encase the over-moulded layer.

2. The assay device according to claim 1, wherein the film is formed from one of the following materials that is compatible with both PCR and pH sensing: $Si_3N_4$, $Ta_2O_5$, $Al_2O_3$ or $SiO_2$.

3. The assay device according to claim 1, wherein the over-moulded layer is formed from a thermoset plastic material.

4. The assay device according to claim 1, wherein the film is less than 10 nm thick.

5. The assay device according to claim 1, wherein the sensing layer is a pH sensing layer.

* * * * *